United States Patent
Liang

(10) Patent No.: US 8,513,522 B2
(45) Date of Patent: Aug. 20, 2013

(54) SHIELDING MECHANISM AND ELECTRONIC DEVICE

(75) Inventor: Yan Liang, Shenzhen (CN)

(73) Assignees: Fu Tai Hua Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 201 days.

(21) Appl. No.: 13/232,141

(22) Filed: Sep. 14, 2011

(65) Prior Publication Data
US 2012/0162872 A1    Jun. 28, 2012

(30) Foreign Application Priority Data
Dec. 27, 2010    (CN) .......................... 2010 1 0607381

(51) Int. Cl.
| | |
|---|---|
| *H02G 3/14* | (2006.01) |
| *H05K 5/03* | (2006.01) |
| *H05K 5/00* | (2006.01) |
| *H05K 7/00* | (2006.01) |
| *H01B 7/00* | (2006.01) |
| *G06F 1/16* | (2006.01) |

(52) U.S. Cl.
USPC .......... 174/66; 174/67; 174/135; 361/679.01; 361/679.02; 361/679.57; 361/679.58

(58) Field of Classification Search
USPC ..... 174/50.51, 559, 66, 67, 135; 361/679.01, 361/679.02, 679.24, 679.41, 679.43, 679.51, 361/679.57, 679.58
See application file for complete search history.

(56) References Cited

U.S. PATENT DOCUMENTS

| | | | | |
|---|---|---|---|---|
| 5,199,888 A | * | 4/1993 | Condra et al. | ................. 439/142 |
| 5,574,625 A | * | 11/1996 | Ohgami et al. | .......... 361/679.09 |
| 6,244,647 B1 | * | 6/2001 | Allison | ...................... 296/37.12 |

* cited by examiner

*Primary Examiner* — Hoa C Nguyen
*Assistant Examiner* — Binh Tran
(74) *Attorney, Agent, or Firm* — Altis Law Group, Inc.

(57) ABSTRACT

A shielding mechanism includes a shielding cover, a pivot shaft, a shielding member, and an elastic member. The shielding cover defines an insert hole. The shielding member is rotatably mounted to the shielding cover via the pivot shaft, and covers the corresponding at least one insert hole. The elastic member is sleeved on the pivot shaft and elastically resists against the shielding member. An electronic device using the shielding mechanism is also provided.

9 Claims, 4 Drawing Sheets

SHIELDING MECHANISM AND ELECTRONIC DEVICE

BACKGROUND

1. Technical Field

The present disclosure generally relates to shielding mechanisms, and particularly to a shielding mechanism and an electronic device using the shielding mechanism.

2. Description of Related Art

A commonly used electronic device, such as a computer, a camera, or a mobile phone, often defines or is equipped with a digital data transmit port, such as a USB port, for transmitting digital data information with other electronic devices. The digital data transmit port of the commonly used electronic device is often exposed to the outside of the device. Thus, when the digital data transmit port is not in use, small substances such as dust, moisture, are prone to attach or enter into the interior of the digital data transmit port. Thus, the utility of such digital data transmit port is affected by the possible contaminants. In addition, as the volume of the electronic device decreases, the digital data transmit port may also decrease, thus making it difficult to pull the digital data connector out from the digital data transmit port of the electronic device, and potentially damaging the digital data transmit port of the electronic device during use.

Therefore, there is room for improvement within the art.

BRIEF DESCRIPTION OF THE DRAWINGS

The components in the drawings are not necessarily drawn to scale, the emphasis instead being placed upon clearly illustrating the principles of the present disclosure. Moreover, in the drawings, like reference numerals designate corresponding parts throughout several views, and all the views are schematic.

DETAILED DESCRIPTION

Figure 1:
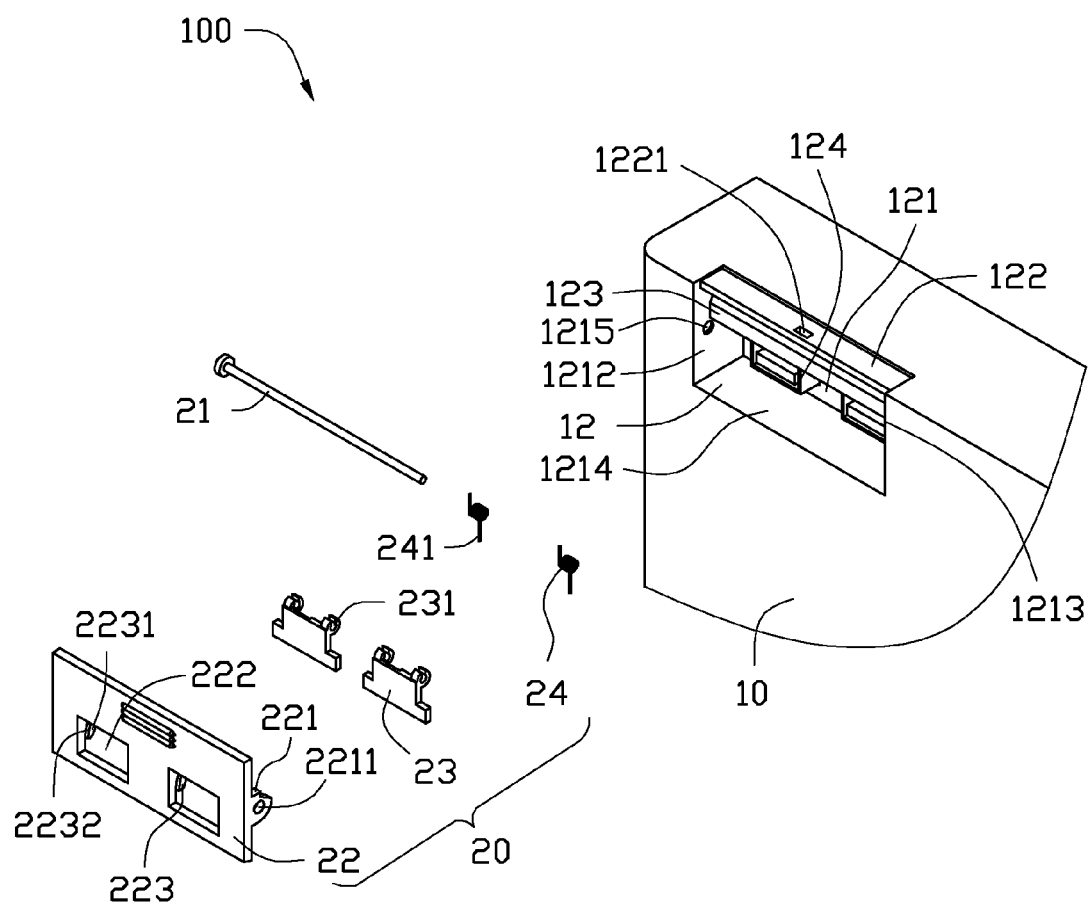
FIG. 1 shows a partially exploded, isometric view of an embodiment of an electronic device, the electronic device includes a main body and a shielding mechanism mounted to the main body.

Referring to FIG. 1, an embodiment of an electronic device 100 is shown. The electronic device 100 includes a main body 10 and a shielding mechanism 20 rotatably mounted to the main body 10.

The main body 10 includes a connector inserting portion 12. The connector inserting portion 12 defines a receiving chamber 121, and includes a baffle plate 122 assembled adjacent to an open end of the receiving chamber 121, a catch rod 123, and two one connecting ports 124. The catch rod 123 is assembled within the receiving chamber 121 and is parallely positioned adjacent to an inner side of the baffle plate 122. The two connecting ports 124 are separately received within the receiving chamber 121 of the main body 10, for establishing an electric connection with other electronic devices during use.

The receiving chamber 121 is substantially U-shaped in the illustrated embodiment, and is recessed from a surface of the main body 10 and communicating with an adjacent side surface of the main body 10. The receiving chamber 121 includes a bottom wall (not labeled) and three side walls 1212, 1213, and 1214. The side walls 1212 and 1213 are parallel to each other, and are oppositely positioned along a direction perpendicular to the side surface of the main body 10. The two side walls 1212, 1213 each define a mounting hole 1215. The side wall 1213 connects with the side walls 1212, 1213, and is positioned opposite to and away from the side surface of the main body 10. The bottom wall and the three side walls 1212, 1213, and 1214 cooperatively define the receiving chamber 121.

The baffle plate 122 is substantially rectangular, and is assembled adjacent to an open end of the receiving chamber 121 and positioned adjacent to the bottom wall of the receiving chamber 121. In the illustrated embodiment, an outer surface of the baffle plate 122 is coplanar with the side surface of the main body 10. A latching hole 1221 is defined through a substantially middle portion of the outer surface of the baffle plate 122.

The catch rod 123 is assembled within the receiving chamber 121, and positioned adjacent to the bottom wall of the receiving chamber 121, thereby exposing the latching hole 1221. Two ends of the catch rod 123 are fixed to the two side walls 1212, 1213 of the receiving chamber 121, respectively.

The connecting port 124 can be a digital data transmit port, such as a universal serial bus port, an audio port, or a video port, for example. In one embodiment, the number of the connecting ports 124 can also be only one or more than two.

The shielding mechanism 20 is rotatably assembled to the main body 10, and received within the receiving chamber 121, for covering the connecting ports 124 in an unused state. The shielding mechanism 20 is capable of being driven to rotate thereby exposing the connecting ports 124 of the main body 10, and thus, the electronic device 100 is capable of connecting with other devices via the connecting ports 124. The shielding mechanism 20 includes a pivot shaft 21, a shielding cover 22, two shielding members 23, and two elastic members 24. In one embodiment, the number of the shielding members 23 and the elastic members 24 could also be one or more than two. The shielding cover 22 is rotatably assembled to the main body 10 via the pivot shaft 21, together with the two shielding members 23, for covering the receiving chamber 121. The two ends of the pivot shaft 21 are respectively assembled to the two mounting holes 1215 of the two side walls 1212, 1213 of the receiving chamber 121.

The shielding cover 22 is substantially rectangular, and has a dimension substantially the same as that of the opening portion of the receiving chamber 121. Two pivot portions 221 are oppositely formed adjacent to two ends of a back surface of the shielding cover 22, facing toward the receiving chamber 121 side. Each pivot portion 221 defines a pivot hole 2211 corresponding to the pivot shaft 21, such that the shielding cover 22 can be rotatably hinged to the two side walls 1212, 1213 of the receiving chamber 121 of the main body 10. Two insert holes 222 are separately defined through the shielding cover 22, corresponding to the two connecting ports 124 disposed within the receiving chamber 121. Two resisting portions 223 are formed on the back surface of the shielding cover 22 toward the receiving chamber 121 of the main body 10, and are positioned adjacent to the two insert holes 222, respectively. Each resisting portion 223 includes a resisting end 2231 extending toward the corresponding one insert hole 222 and partially positioned behind the insert hole 222. One side of the resisting end 2231 forms a cam surface 2232 facing toward the insert hole 222. A contour of the cam surface 2232 in the illustrated embodiment is substantially involute curve shaped.

Figure 2:
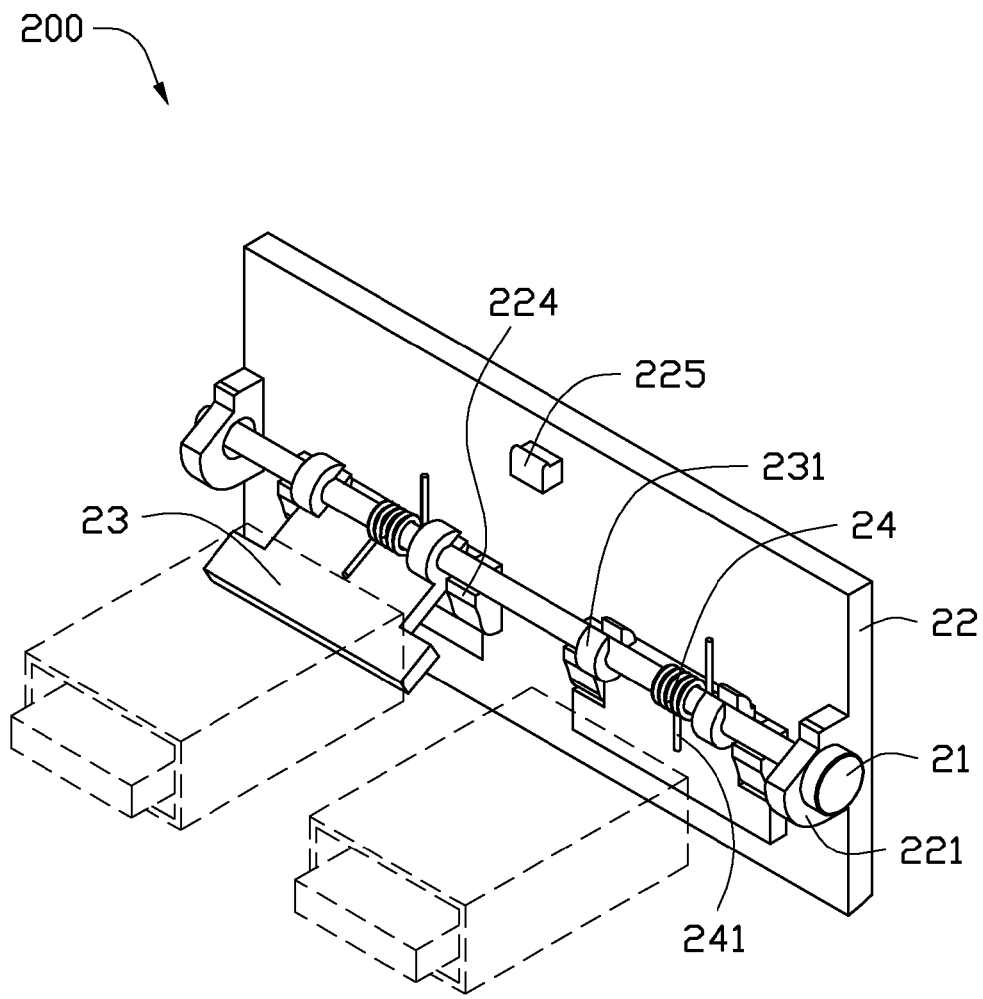
FIG. 2 shows an assembled isometric view of the shielding mechanism of FIG. 1, viewed from another aspect.

Also referring to FIG. 2, two limit portions 224 are separately formed on the back surface of the shielding cover 22, and coaxially positioned between the two pivot portions 221. An elastic and deformable latching portion 225 is formed on the back surface of the shielding cover 22 and positioned adjacent to one side thereof, corresponding to the latching hole 1221 of the baffle plate 122. The elastic latching portion 225 detachably engages with the corresponding latching hole 1221 of the baffle plate 122.

The two shielding members 23 are rotatably and separately assembled to the back surface of the shielding cover 22 via the pivot shaft 21, corresponding to the two connecting ports 124, and are covered on the two insert holes 222 of the shielding cover 22, respectively. Each shielding member 23 includes two hinged portions 231 separately formed on one end, and rotatably hinged with the pivot shaft 21.

The two elastic members 24 are separately assembled to the pivot shaft 21 for keeping the corresponding shielding member 23 elastically resisting against the back surface of the shielding cover 22, and covering the corresponding one insert hole 222. In the illustrated embodiment, the two elastic members 24 are two torsion springs separately sleeved on pivot shaft 21. Each elastic member 24 is positioned between the two hinged portions 231 of one corresponding shielding member 23, with two ends 241 resisting against the back surface of the shielding cover 22 and the one corresponding shielding member 23, respectively.

Figure 4:
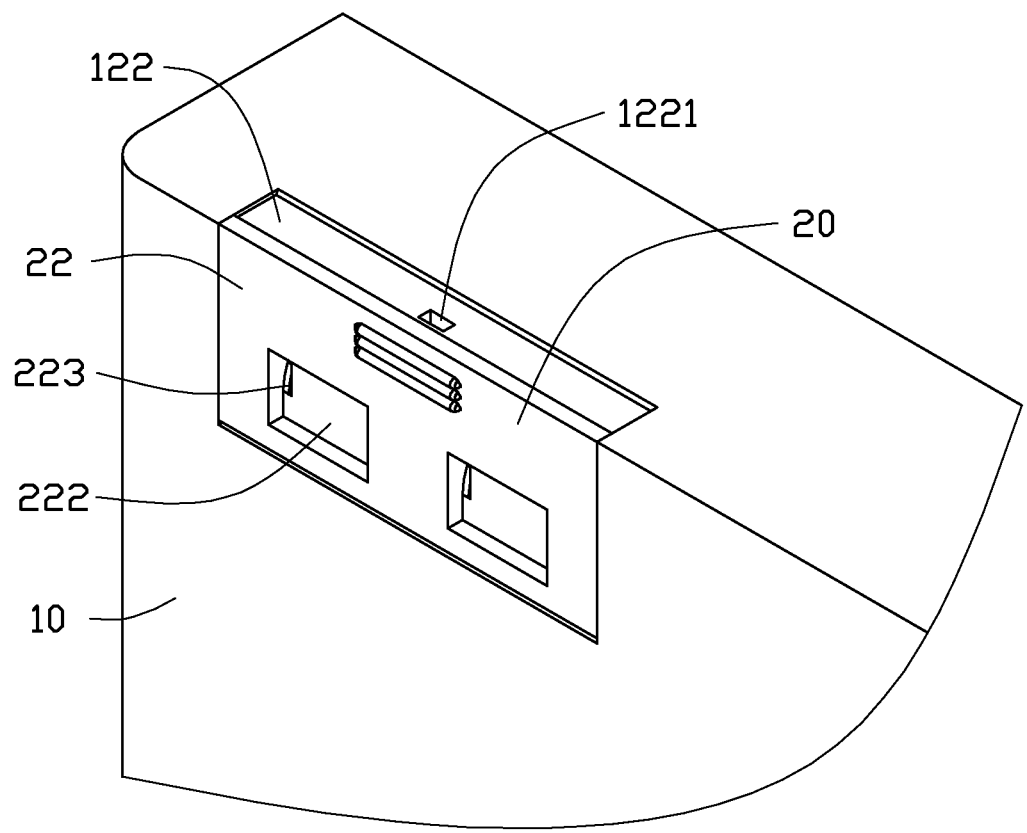
FIG. 4 shows a second state of the electronic device of FIG. 1, wherein the shielding mechanism is in a closed state.

FIG. 4 is a closed state of the electronic device 100. The shielding cover 22 together with the two shielding members 23 are fully covered upon and are received within the receiving chamber 121 of the main body 10 for preventing contaminants such as dust and moisture, from attaching or entering into the interior of the connecting port 124 of the electronic device 100. One side of the shielding cover 22 abuts against the baffle plate 122. The two shielding members 23 elastically resist against the back surface of the shielding cover 22, and cover the corresponding two insert holes 222 of the shielding cover 22. The elastic latching portion 225 engages into the corresponding latching hole 1221 of the baffle plate 122 for preventing the shielding cover 22 from being opened accidently.

Figure 3:
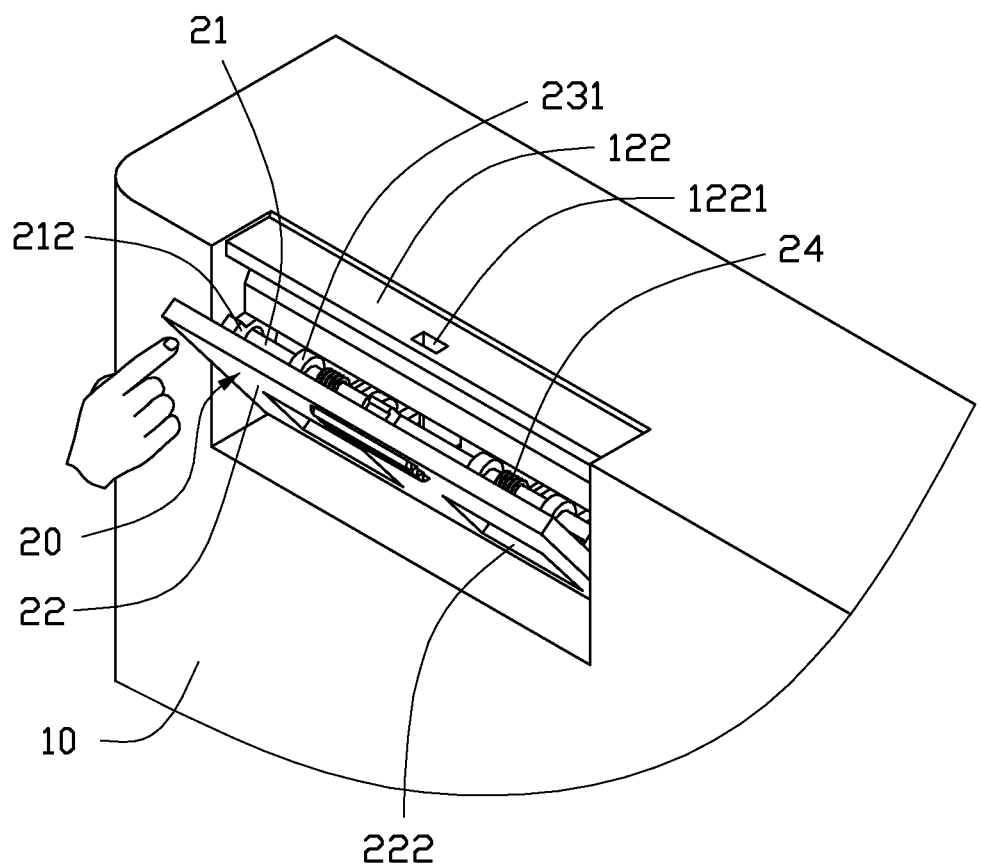
FIG. 3 shows a first state of the electronic device of FIG. 1, wherein the shielding mechanism is in an opened state.

Also referring to FIG. 3, as in use, a connector of an external device such as a storing U-disc, is inserted into the insert hole 222 and a distal end of the connector resists against the shielding member 23, thereby driving the shielding member 23 to rotate to expose the insert hole 222. The external device further resists against the resisting portion 223 of the shielding cover 22, thereby driving the shielding cover 22 to rotate, and disengage the latching portion from the corresponding latching hole 1221 of the baffle plate 122. Meanwhile, the elastic members 24 are deformed thereby generating and storing a torsional force. An outer force is further applied to the connector of the external device toward the corresponding connecting port 124 until the connecting port 124 is electrically connected to the corresponding connecting port 124 within the receiving chamber 121.

When the external device from the connecting port 124 of the electronic device 100 needs to be detached, a small force is applied to the external device along a direction away from the connecting port 124. Meanwhile, the torsional force stored by the elastic members 24 is applied to drive the shielding cover 22 to rotate back to its original position. The resisting portion 223 of the shielding cover 22 resists against and pushes the external device to depart away from the corresponding connecting port 124. Thus, the external device can be quickly and easily detached from the connecting port 124 of the electronic device 100.

Finally, while various embodiments have been described and illustrated, the disclosure is not to be construed as being limited thereto. Various modifications can be made to the embodiments by those skilled in the art without departing from the true spirit and scope of the disclosure as defined by the appended claims.

What is claimed is:

1. An electronic device, comprising: a main body comprising a connector inserting portion; and a shielding mechanism, comprising: a pivot shaft; a shielding cover rotatably mounted to the main body via the pivot shaft for covering the connector inserting portion, the shielding cover defining at least one insert hole; at least one shielding member rotatably mounted to a back surface of the shielding cover via the pivot shaft, and positioned between the shielding cover and the connector inserting portion, for covering the at least one insert hole; and at least one elastic member sleeved on the pivot shaft and elastically resisting against the at least one shielding member; a baffle plate assembled adjacent to an open end of the receiving chamber, the baffle plate defines a latching hole; the shielding cover further comprises an elastic and deformable latching portion formed on the back surface of the shielding cover, the latching portion detachably engages into the latching hole of the baffle plate.

2. The electronic device of claim 1, wherein the connector inserting portion defines a receiving chamber, and comprises at least one connecting port disposed within the receiving chamber; the shielding cover comprises two pivot portions oppositely formed adjacent to two ends of the back surface of the shielding cover, each pivot portion defines a pivot hole corresponding to the pivot shaft, the pivot shaft passes through the two pivot holes of the two pivot portions and hinges to the connector inserting portion and received within the receiving chamber.

3. The electronic device of claim 2, further comprising at least one resisting portion formed on the back surface thereof, and position adjacent to the at least one insert hole.

4. The electronic device of claim 3, wherein the resisting portion has a resisting end extending towards the at least one insert hole and partially positioned behind the at least one insert hole.

5. The electronic device of claim 4, wherein one side of the resisting end forms a cam surface facing toward the at least one insert hole.

6. The electronic device of claim 5, wherein the contour of the cam surface is substantially involute curve shaped.

7. The electronic device of claim 2, further comprising at least one limit portion formed on the back surface of the shielding cover, and coaxially positioned between the two pivot portions.

8. The electronic device of claim 7, further comprising two hinged portions separately formed on one end of the shielding member, and rotatably hinged with the pivot shaft.

9. The shielding mechanism of claim 8, wherein the at least one elastic member is at least one torsion spring sleeved on the pivot shaft, and positioned between the two hinged portions of the at least one shielding member, two ends of the elastic member resist against the back surface of the shielding cover and the at least one shielding member, respectively.

* * * * *